United States Patent
Kitagawa (10) Patent No.: US 6,426,302 B2
(45) Date of Patent: Jul. 30, 2002

(54) PROCESS FOR PRODUCING SEMICONDUCTOR DEVICE

(75) Inventor: Hideo Kitagawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/778,943

(22) Filed: Feb. 8, 2001

Related U.S. Application Data (62) Division of application No. 09/399,112, filed on Sep. 20, 1999, now Pat. No. 6,217,703.

(30) Foreign Application Priority Data

Sep. 22, 1998 (JP) .......................................... 10-268785

(51) Int. Cl.$^7$ .......................................... H01L 21/302
(52) U.S. Cl. ..................... 438/710; 438/729; 216/63; 134/1
(58) Field of Search .................. 438/706, 710, 438/729; 216/63, 67; 156/345; 134/1, 1.1, 1.2, 1.3

(56) References Cited

U.S. PATENT DOCUMENTS

| | | | |
|---|---|---|---|
| 4,492,620 A | 1/1985 | Matsuo et al. | 204/192.1 |
| 4,563,610 A * | 1/1986 | Takagi et al. | 250/423 R |
| 5,292,370 A * | 3/1994 | Tsai et al. | 118/723 |
| 5,783,102 A | 7/1998 | Keller | 156/345 |
| 5,818,040 A * | 10/1998 | Kinoshita et al. | 250/251 |

FOREIGN PATENT DOCUMENTS

JP 08-181125 7/1996

* cited by examiner

Primary Examiner—Benjamin L. Utech
Assistant Examiner—Kin-Chan Chen
(74) Attorney, Agent, or Firm—Fitzpatrick, Cella, Harper & Scinto (57) ABSTRACT

A plasma processing apparatus having a vacuum vessel and a supporting means for supporting a processing target in the vacuum vessel, the apparatus comprising means for introducing a gas into a plasma generating space, means for feeding electric energy to the gas in the plasma generating space to generate a plasma, a metal member for forming negative ions which is provided on the downstream side of the plasma generating space in such a way that it comes into contact with particles of the plasma, and means for feeding the negative ions to the processing target. Utilizing the electric charge exchange reaction between plasma particles and metal surfaces, negative ions can be formed continuously and in a high density and also the negative ions can be made incident on a processing target to make ashing, etching or cleaning of the processing target to remove unwanted matter therefrom, so that a high processing rate and less charge-up damage can be achieved.

3 Claims, 7 Drawing Sheets

FIG. 7B PRIOR ART the phenomenon that the electrons, which are light, have so high a lateral-direction velocity that they do not reach the bottoms of deep holes, but the ions, which have a large mass, have

PROCESS FOR PRODUCING SEMICONDUCTOR DEVICE

CONTINUING DATA

This application is a division of application Ser. No. 09/399,112, filed Sep. 20, 1999, now U.S. Pat. No. 6,217, 703B1 issued Apr. 17, 2001.

BACKGROUND OF THE INVENTION

1. Field of the Invention

This invention relates to a plasma processing apparatus and a processing method making use of the same. More particularly, it relates to a plasma processing apparatus or system by which negative ions can be generated in a large quantity and also the negative ions can be made incident on a processing article or target to etch or clean the processing target to remove unwanted matter therefrom, and a processing method making use of the same. This plasma processing apparatus is preferably used in processes for producing semiconductors such as LSIs, optical devices such as optical disks and waveguides, and magnetic devices such as magnetic disks.

2. Related Background Art

Figure 5:
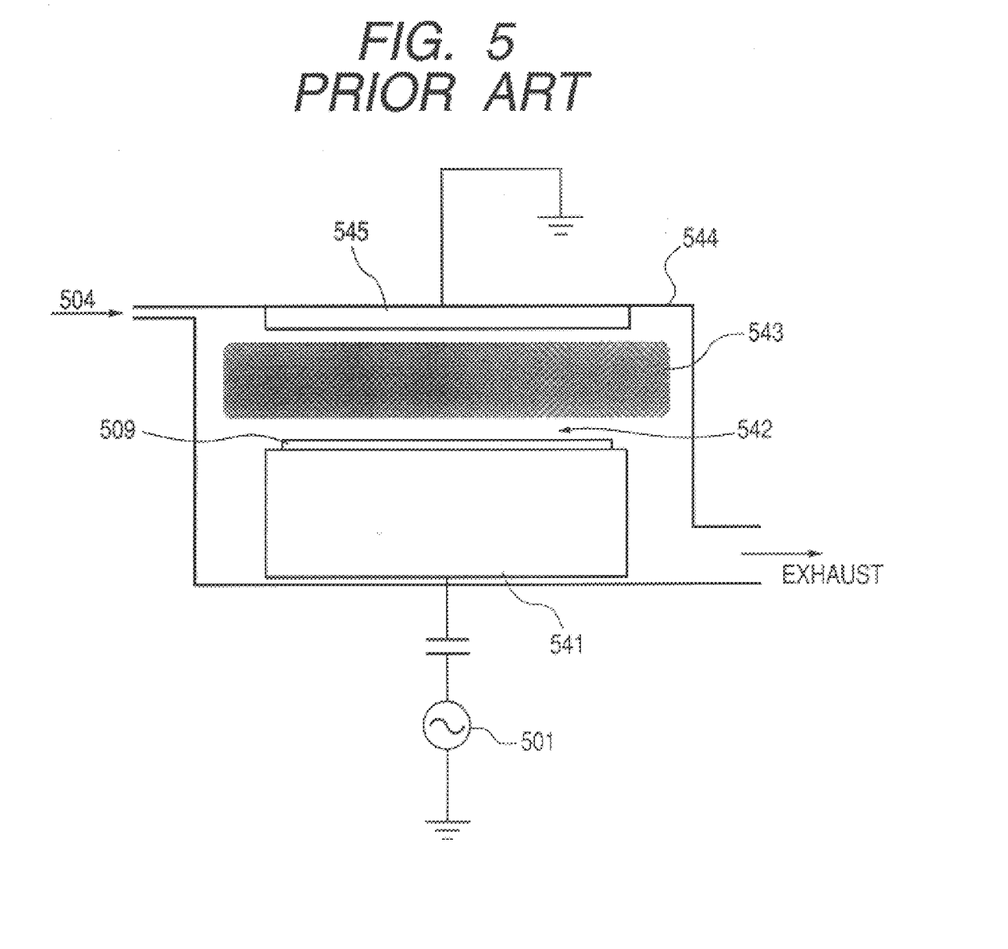
FIG. 5 is a diagrammatic cross-sectional illustration of an example of a conventional plasma processing apparatus.

In conventional plasma processing, positive ions have chiefly been utilized, as disclosed in, e.g., Integrated Circuit Processing Technique Series, Semiconductor Dry Etching Techniques, p.41 (compiled by Takashi Tokuyama, Sangyo Tosho K.K.). FIG. 5 is a diagrammatic cross-sectional illustration of an example of a parallel plate plasma etching apparatus conventionally used. In FIG. 5, reference numeral 501 denotes a high-frequency power source; 541, a high-frequency electrode; 509, a semiconductor substrate (processing article or target), 542, an ion source; 543, a plasma; 544, a vacuum vessel; 545, a grounded electrode; and 504, a processing gas inlet. In this apparatus, the electrode 541 to which a high frequency power is to be applied to form the plasma is provided inside the vacuum vessel 544. Also, the processing target 509 to be processed is placed on the electrode 541 to which a high-frequency power is to be applied. Upon application of a high-frequency power to the electrode 541, the plasma 543 is formed between the grounded electrode 545 and the high-frequency electrode 541 which are provided in parallel. Here, a region where electrons are absent, called an ion sheath, is formed between the plasma 543, the high-frequency electrode 541 and the vacuum vessel 544 because of a difference in mobility between ions and electrons in the plasma 543, so that with respect to the electrode the plasma has positive potential on the average. The electrode 541 to which a high-frequency power is applied has a great potential difference with respect to the plasma, compared with the grounded electrode 545, and may have even a difference of hundreds of volts at maximum. The positive ions in the plasma 543 are accelerated by the potential of such a sheath, and are incident on the processing target 509 while having a certain energy. Conventional apparatuses have utilized energy particles composed of such positive ions to carry out etching and cleaning of substrate surfaces.

However, in the processing with positive ions which has conventionally been used, positive electric charges accumulate on the processing target surface during processing. This is ascribable to the lateral-direction velocity difference that is due to thermal motion of ions and electrons, and is a phenomenon that the electrons, which are light, have so high a lateral-direction velocity that they do not reach the bottoms of deep holes, but the ions, which have a large mass, have so low a lateral-direction velocity that they reach the bottoms of deep holes, thus the positive electric charges accumulate on the bottoms of deep holes. Also, such a charging phenomenon is further amplified because of the release of secondary electrons that is caused by energy bombardment of ions. This charging has caused a difficulty that a great electric field which is greater than breakdown voltage is applied to the gate oxide film of a field-effect transistor to cause a breakdown, or a problem that the course of positive ions incident on the processing target is bent by Coulomb force because of the charging of a resist mask to cause etching malformation.

Figure 6:
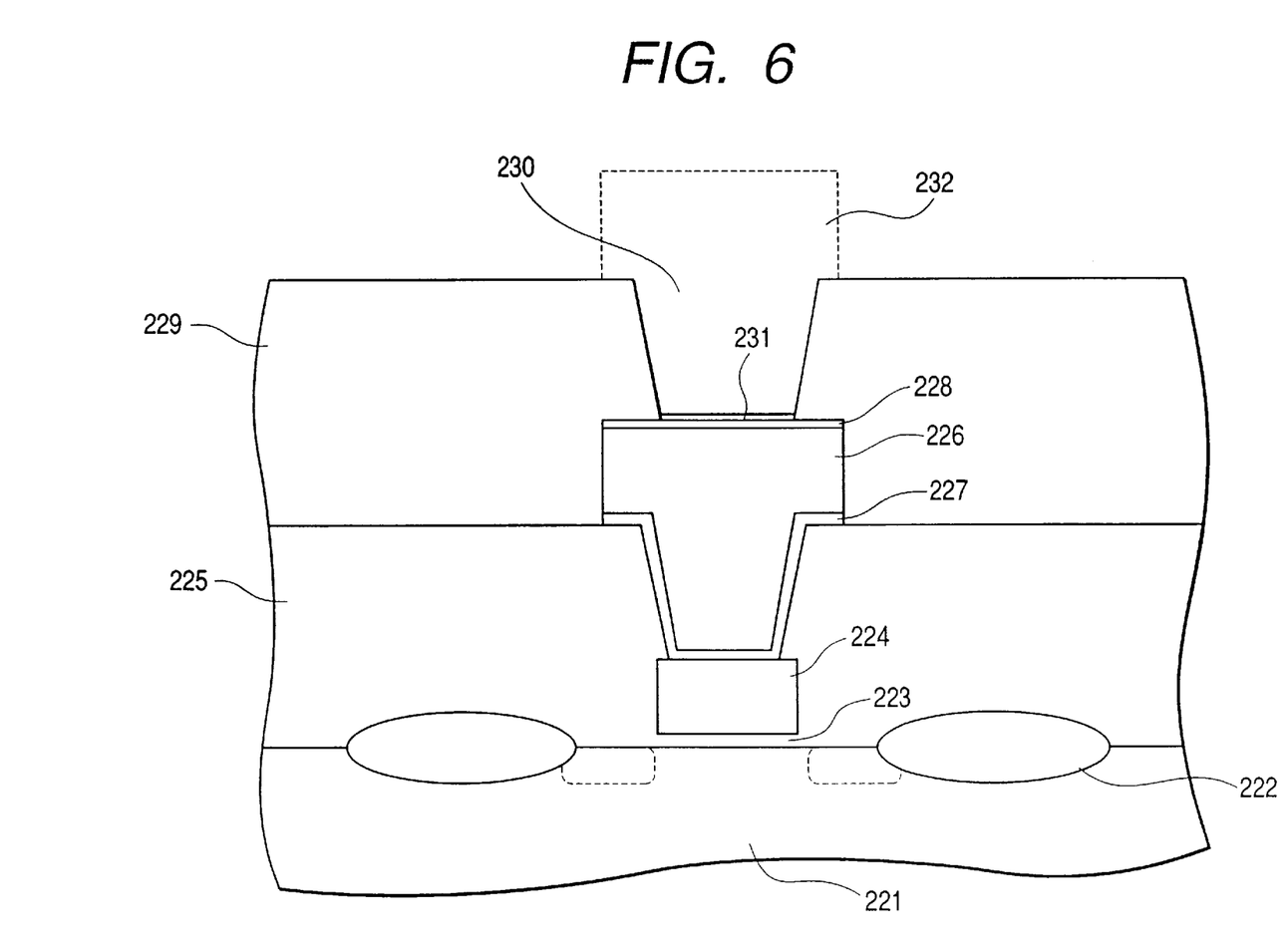
FIG. 6 is a diagrammatic view showing a cross-sectional structure of a processing target.

FIG. 6 illustrates an unfinished semiconductor device having a via hole 230. Reference numeral 221 denotes a silicon substrate; 222, a device separating insulating film; 223, a gate oxide film; 224, a gate electrode; 225 and 229, interlayer insulating films; and 227 and 228, barrier metal layers.

When the unfinished semiconductor device having a cross-sectional structure as shown in FIG. 6 is subjected to cleaning with positive ions, native oxide films or crystal defects brought in by ion bombardment at the time of etching remain at the bottoms of via holes for connecting wirings formed on the silicon substrate surface. Hence, if second-layer metal wiring 232 is formed in the state the via holes are left as they are, the native oxide films or crystal defects make the via holes have a high resistance to bring about circuit retardation or wiring faulty conduction, as known in the art. Accordingly, these residual matter must be removed by cleaning or the like. However, since the device having been processed by cleaning is taken out in the atmosphere, native oxide films again grow on the cleaned surface, and hence the cleaning and the formation of the second-layer metal wiring 232 may preferably be carried out while the device is kept in vacuum. As cleaning methods meeting such a demand, methods making use of plasma have widely and commonly been used. What comes into question here is the phenomenon of charge-up caused by plasma. When this cleaning is carried out by conventional positive ion processing, the positive electric charges introduced by plasma flow to the gate electrode 224 through first-layer metal wiring 226, and finally a voltage is applied to the gate oxide film 223 present between the silicon substrate 221 and the gate electrode 224. Once this voltage reaches a breakdown voltage, the gate oxide film results in electrostatic breakdown. Also, a very weak tunnel electric current may flow through the gate oxide film 223 even at a voltage below breakdown voltage to cause a great deterioration of its lifetime. There have been such problems.

As discussed above, only positive ions have ever been utilized in semiconductor fabrication processes and negative ions have little been utilized. Recently, however, for the purpose of solving the problems arising from positive ions, negative ions present in processing plasma have attracted notice. The following methods are proposed as plasma processing that utilize negative ions.

Figure 7A:
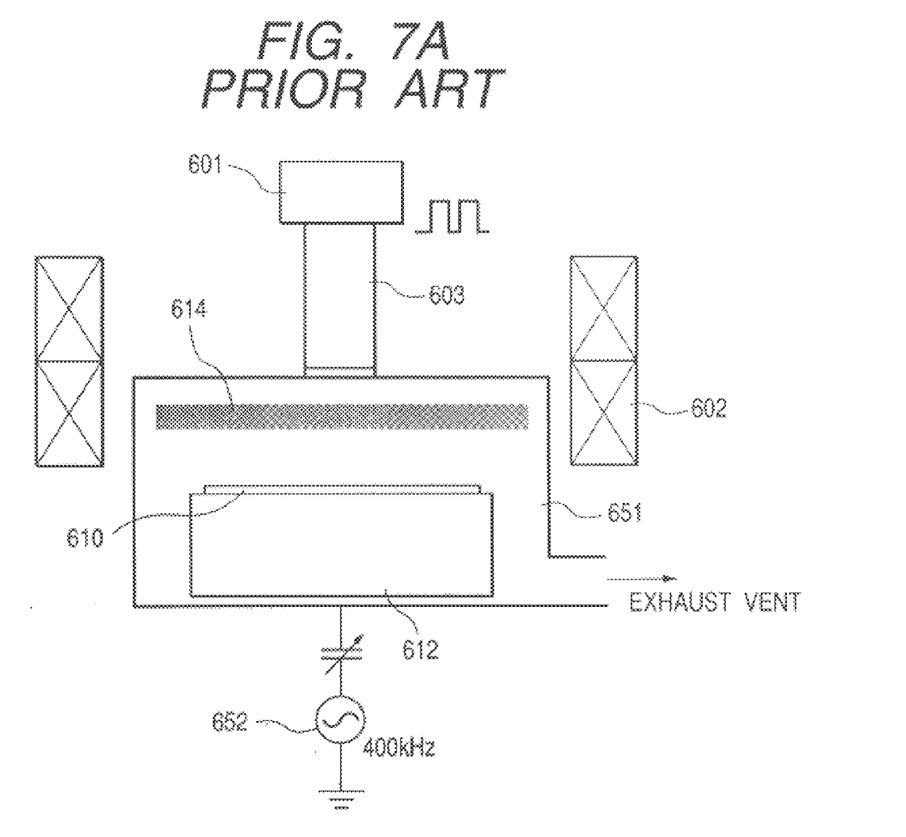
FIG. 7A is a diagrammatic cross-sectional illustration of an example of conventional plasma processing apparatuses.
Figure 7B:
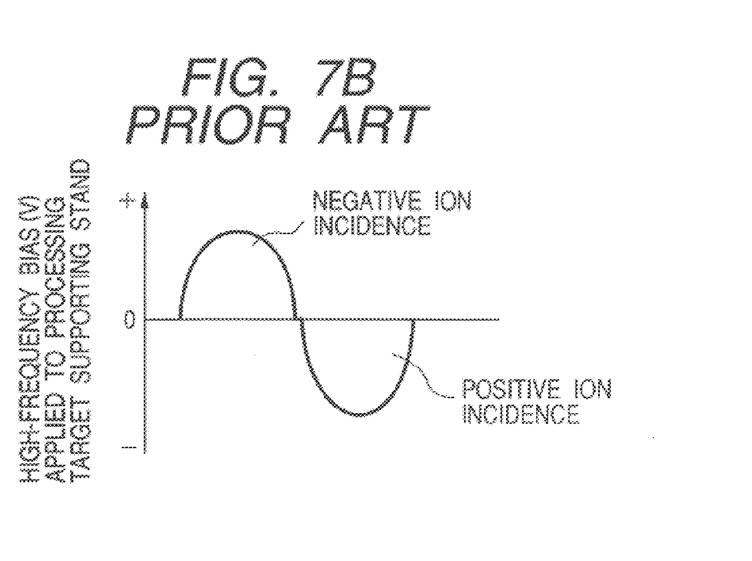
FIG. 7B is a graph showing the relationship between RF voltage and positive/negative ions.

(1) Method Making Use of Time Afterglow of Plasma:

An apparatus as shown in FIGS. 7A and 7B, disclosed in Japanese Patent Application Laid-Open No. 8-181125, can be given as an example of an apparatus utilizing this method. In FIG. 7A, reference numeral 601 denotes a microwave power source; 602, a magnetic-filed coil; 603, a waveguide; 610, a processing target; 612, a processing target supporting stand; 614, a plasma; 651, a vacuum vessel; and 652, a high-frequency power source. In this method, the plasma 614, which is formed by pulse-modulating microwaves generated from the microwave power source, is made on/off, and, in the period of plasma-off, the plasma temperature is lowered to form negative ions. Also, a high-frequency bias is applied from the high-frequency power source 652 to the supporting stand 612 of the processing target 610 in synchronization with the pulse modulation of the plasma 614 to draw positive/negative ions alternately into the processing target 610 as shown in FIG. 7B, thus the processing target 610 is processed.

(2) Method Making Use of Spatial Afterglow to Guide Plasma Spatially Downstream:

Not shown in the drawing, this method is a method in which the processing target is placed downstream by tens of centimeters from the region of plasma formation so that negative ions formed while being diffused downstream and cooled gradually are utilized.

The above two methods, however, have had the following problems.

i) In the method making use of pulse-modified plasma, positive ions are formed in the remaining half period where plasma stands "on", and hence a high efficiency is promised for etching apparatuses of positive/negative-ion alternating irradiation. However, in the case of etching carried out by predominantly using negative ions, it is difficult to attain a high efficiency because the negative ions are formed only in the half of the processing time.

ii) In the method where plasma is guided spatially downstream to lower plasma temperature to form negative ions, the recombination of plasma at vacuum vessel walls causes an abrupt decrease in plasma density itself, and hence the plasma formed in a high density can not efficiently be converted into negative ions.

Thus, in these conventional methods, there has been room for improvement in respect of large-quantity formation of negative ions and effective processing.

SUMMARY OF THE INVENTION

An object of the present invention is to provide a plasma processing apparatus by which, utilizing the electric charge exchange reaction between plasma particles and metal surfaces, negative ions can be formed continuously and in a high density and also the negative ions can be made incident on a processing target to make ashing, etching or cleaning of the processing target to remove unwanted matter therefrom, so that a high processing rate and less charge-up damage can be achieved; and a processing method making use of such an apparatus.

The plasma processing apparatus according to the present invention is a plasma processing apparatus having a vacuum vessel and supporting means for supporting an article in the vacuum vessel, the apparatus comprising:

means for introducing a gas into a plasma generating space;

means for feeding electric energy to the gas in the plasma generating space to generate a plasma;

a metal member for forming negative ions which is provided on the downstream of the plasma generating space in such a way that it comes into contact with particles of the plasma; and means for feeding the negative ions to the article.

DESCRIPTION OF THE PREFERRED EMBODIMENTS

Constitution and operation of the plasma processing apparatus according to the present invention will be explained below with reference to the accompanying drawings.

Figure 1:
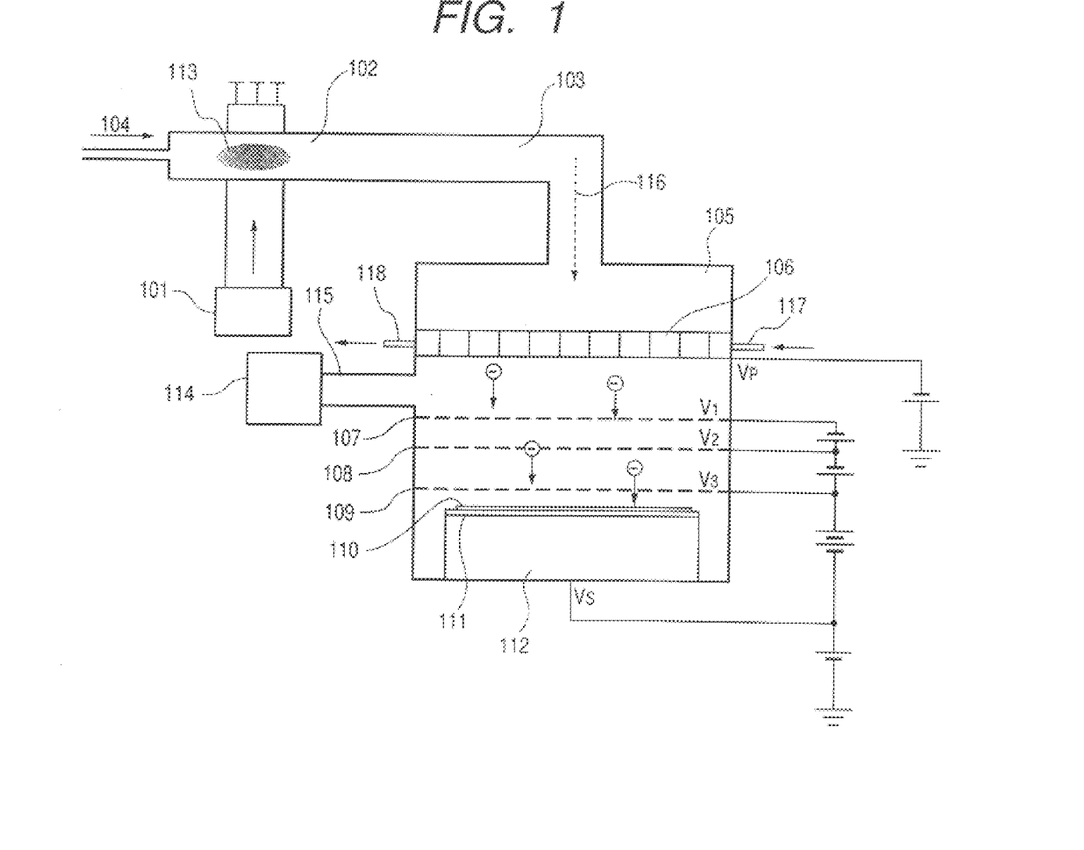
FIG. 1 is a diagrammatic cross-sectional illustration of an example of the plasma processing apparatus according to the present invention.

FIG. 1 is a diagrammatic cross-sectional illustration of an example of the plasma processing apparatus according to the present invention. In FIG. 1, reference numeral 101 denotes a microwave power source as an electric energy feed source; 102, a plasma generating space; 103, a transport tube; 104, a processing-gas inlet; 105, a processing chamber; 106, a metal member; 107, a first preliminary grid electrode provided optionally; 108, a second preliminary grid electrode provided optionally; 109, a grid electrode; 110, a processing target (article); 111, an insulating plate provided optionally; 112, a processing target supporting stand; 113, a plasma; and 114, exhaust means; 115, an exhaust duct; 116, a flow of neutral active species; 117, a cooling-water inlet for introducing cooling water as a refrigerant; and 118, a cooling-water outlet.

In the plasma processing apparatus shown in FIG. 1, the processing target is processed with plasma in the following procedure.

First, a gas containing a halogen element such as fluorine, chlorine, bromine or iodine and/or a gas containing oxygen is/are fed into the plasma generating space 102 through the processing-gas inlet 104 serving as gas introducing means, and also microwaves are fed from the microwave power source 101 to form the plasma 113.

Next, the plasma 113 formed in the plasma generating space 102 is transported through the transport tube 103 to the processing target processing chamber 105 positioned downstream as viewed from the plasma generating space 102. In this course, particles of plasma, i.e., positive ions generated in the plasma generating space 102 recombine with electrons to disappear, so that the greater part of the particles of plasma comprises neutral active species.

The plasma used here may be generated by any processes of a parallel electrodes type, an ICP (inductive coupling plasma) type, a magnetron type, an ECR (electron cyclotron resonance) type, a helicone wave type, a surface wave type, a surface wave interference type making use of a planar multiple-slot antenna, and an RLSA (radial line slot antenna) type. Taking account of the fact that the plasma density decreases when the plasma formed is diffused into the processing target processing chamber 105 positioned downstream as viewed from the plasma generating space 102, preferred is a process in which the plasma density is as high as possible. Also, in the apparatus shown in FIG. 1, the plasma generating space 102 and the inside of the processing chamber 105 are evacuated through the same exhaust means 114 and exhaust duct 115. Alternatively, in order to both achieve a high plasma density and process the processing target in an optimum state, the plasma generating space 102 and the inside of the processing chamber 105 may be evacuated through exhaust means and exhaust ducts which are provided separately from each other.

The negative ions are generated through a process as described below.

The flow 116 of neutral active species having reached the processing target processing chamber 105 through the transport tube 103 is brought into contact with the plate-like metal member 106 provided in the processing target processing chamber 105. This contact causes what is called the electric-charge exchange reaction, through which particles of neutral active species accept free electrons present in metal, whereupon the neutral active species are converted into negative ions.

In this description, the conversion of neutral active species into negative ions is taken as an example. Positive ions may also be brought into contact with metal, where similar electric-charge exchange reaction takes place and the negative ions are formed.

Here, taking account of corrosion resistance to halogen gases, the metal member 106 provided in the processing target processing chamber 105 may preferably be made of a material the whole or at least only the surface of which is constituted of a noble metal as exemplified by gold, platinum, silver, ruthenium, rhodium, palladium, osmium or iridium. Also, in order to prevent the metal member 106 from its corrosion due to the exposure to plasma which makes it have a high temperature, it is required to be optionally cooled with a refrigerant.

As for the probability of electric-charge exchange reaction, the reaction more readily takes place as the metal surface has a lower work function. Accordingly, as materials for the metal member 106, it is preferable to select materials having a small work function, from among the above metals having a high corrosion resistance. Also, the electric-charge exchange reaction can be improved in efficiency by imparting a negative potential $V_p$ ($V_p<0$) to the metal member 106.

Figure 2:
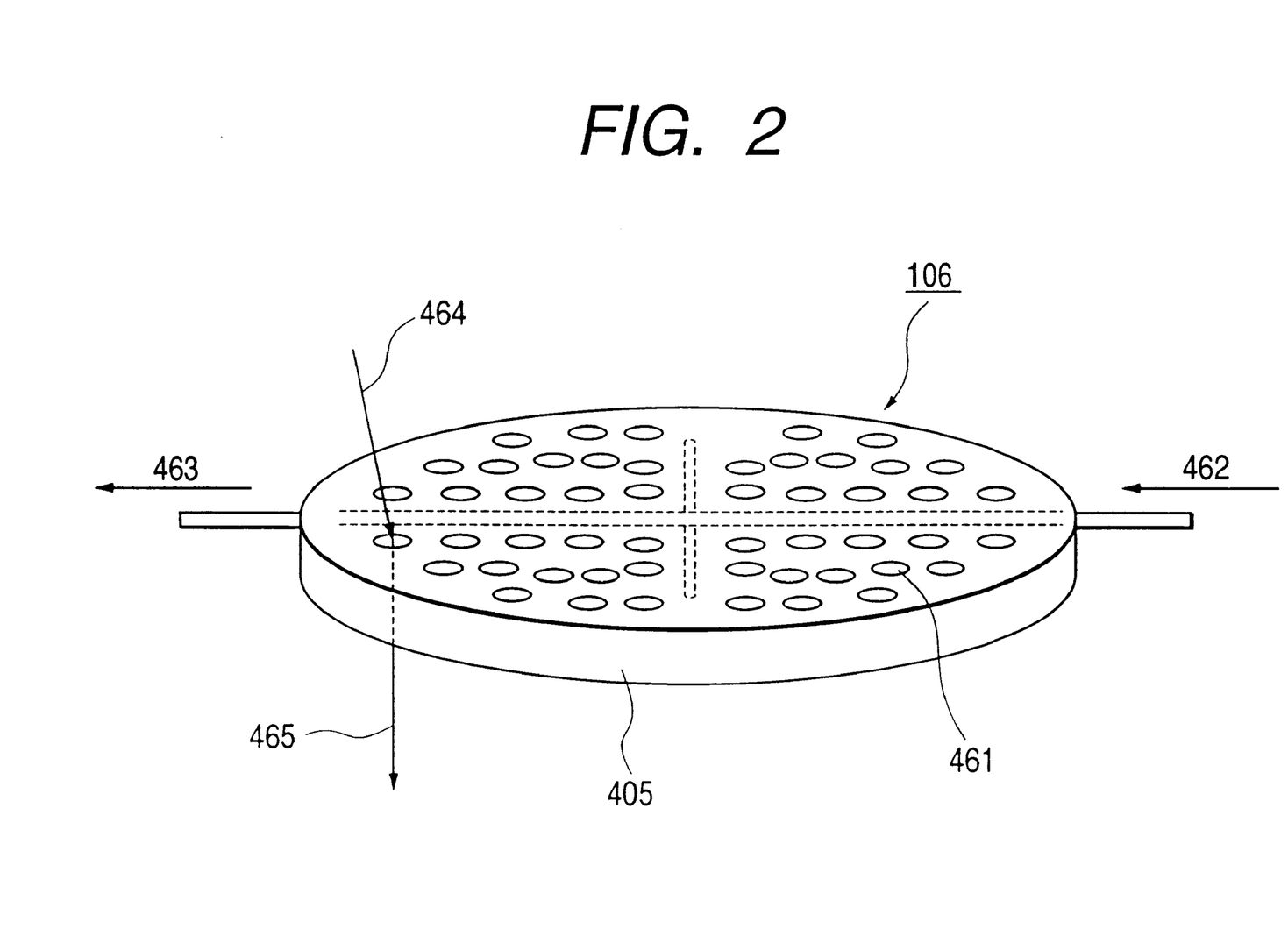
FIG. 2 is a diagrammatic view of a metal member constituting the plasma processing apparatus according to the present invention.

FIG. 2 shows an example of the metal member 106.

The metal member 106 may also preferably have a surface area as large as possible, because the electric-charge exchange reaction on the surface of the metal member 106 is utilized. For example, the shape as shown in FIG. 2, in which a large number of minute gas passage holes 461 are made in a metal plate 405, can be given as an example of preferable shapes. Also, negative gases having a high electronegativity as exemplified by halogen gases such as fluorine, chlorine, bromine and iodine can readily cause the neutral active species 464 and the combination of molecules with electrons. Hence, use of such gases enables formation of the negative ions 465 in a large quantity. In order to prevent the metal plate 405 from its temperature rise due to exposure to plasma, a cooling-water inlet 462 and a cooling-water outlet 463 may further be provided as means for cooling the metal member 106. In the present invention, the metal member 106 is by no means limited to the one having the shape as shown in FIG. 2.

In order to take out the negative ions predominantly from the plasma thus formed, containing negative ions in a large quantity, the grid electrode 109 is provided in the vacuum vessel, for example. Then, the first preliminary grid electrode 107 and the second preliminary grid electrode 108 are optionally provided. Also, without providing these grid electrodes, a positive voltage may be applied to the processing target supporting stand 112, or only the grid electrode 109 may be provided and a positive voltage may be applied thereto. Positive voltages $V_1$ and $V_2$ are further applied to the first and second preliminary grid electrodes, respectively, and the voltages are so set as to be $V_2>V_1>0>V_p$. Here, the $V_p$ is a votage applied to the metal member 106, which is usually the value of zero or minus. Since the grid electrodes are disposed in this way, the negative ions are accelerated by an energy expressed as $V_2-V_p$ (eV), and are withdrawn in the direction vertical to the two grids and also in the direction of the processing target 110. The energy of negative ions can arbitrarily be controlled by adjusting the values of $V_1$ and $V_2$.

In FIG. 1, shown is an example in which two preliminary grid electrodes are provided as members for withdrawing the negative ions. However, in order to withdraw the negative ions, at least one grid electrode may be provided as described above. In the downstream direction of the negative ions thus withdrawn, the processing target supporting stand 112 is disposed.

In this case, the grid electrode 109 provided just in front of the supporting stand 112 has also the function to capture secondary electrons. Positive voltages $V_s$ and $V_3$ are applied to the supporting stand 112 and grid electrode 109, respectively, and the values of voltage are so set as to be $V_3>V_s>0$. The voltage of $V_3$ may be any of DC voltage and pulsewise voltage so long as it is positive voltage.

Thus, the negative ions withdrawn from the plasma have the energy of $V_2-V_p$ (eV) and strike on the processing target 110. Secondary electrons released from the surface of the processing target 110 are also accelerated by a potential of $V_3-V_s$, and are captured by the secondary-electron capturing grid 109, so that any excess negative electric charges can be prevented from accumulating on the surface of the processing target 110. Hence, in the apparatus according to the present invention, the incident energy of negative ions striking on the processing target 110 and the quantity of secondary electrons released from the substrate surface can arbitrarily be controlled by controlling the potentials of $V_3$ and $V_s$. Also, if the processing target 110 is directly placed on the processing target supporting stand 112, the negative electric charges having accumulated on the surface of the processing target 110 may flow into the supporting stand 112 through a gate oxide film (not shown) formed on the processing target 110, consequently bringing about a break of the gate oxide film. In order to prevent this, the insulating plate 111 is provided between the supporting stand 112 and the processing target 110. As materials for the insulating plate 111, aluminum oxide and aluminum nitride are considered as examples, but materials having insulating properties and a high plasma resistance are all usable.

Plasma processing of processing targets with use of only negative ions by means of the apparatus according to the present invention brings about the following advantages.

i) Even when the negative ions are incident on the processing target (e.g., a semiconductor substrate), the secondary electrons are released so long as the incident energy is 10 eV or above, and hence the processing target can be prevented from being negatively charged. Also, even when the incident energy is 10 eV or above and the number of release of secondary electrons is two or more, there occurs the action that the electrons are drawn back to the processing target standing positively charged, and hence it can be expected to obtain the effect that the charging voltage saturates at few volts to become stable.

ii) There is another advantage that the surface temperature of the processing target on which the negative ions have been made incident is lower than that of the case where positive ions are incident thereon. This is due to the fact that the reaction by which positive ions return to neutral atoms is an exothermic reaction of 17 eV and on the other hand the reaction by which negative ions return to neutral atoms is an endothermic reaction of 3 eV. As a result, even when the negative ions are incident on the processing target, the processing target has, in the vicinity of ion incident points, a local surface temperature that is lower than when positive ions are incident. Hence, any thermal damage (e.g., crystal disorder, or change in properties of resist masks) to the processing target can be kept small.

As described above, using negative ions, the plasma processing apparatus according to the present invention can materialize good plasma processing which may cause no surface charging of the processing target, may cause neither electrostatic breakdown of gate oxide films nor etching malformation due to a bend of the course of ions and also may cause less thermal damage to the processing target.

The gas formed into plasma, used in the present invention, i.e., the gas serving as the source of negative ions includes gases containing halogen elements and gases containing oxygen.

Stated specifically, it includes gases composed of halogen elements alone, such as $F_2$, $Cl_2$, $I_2$ and $Br_2$, halogen compound gases such as $CF_4$, $C_2F_6$, $C_3F_8$, $CCl_2F_2$, $CBrF_3$, $CCl_4$, $C_2Cl_2F_4$, $BCl_3$ and $NF_3$, and oxygen-containing gases such as $O_2$ and $O_3$.

Voltages applied to the supporting stand and grid electrode used in the present invention are voltages sufficient for feeding the negative ions predominantly to the processing target. Stated specifically, the voltage applied to the supporting stand may preferably be from +50 V to +200 V, and more preferably be from +80 V to +200 V.

The voltage applied to the grid electrode may preferably be from +20 V to +200 V, and more preferably be from +80 V to +200 V.

In the case where the grid electrode is provided in plurality as shown in FIG. 1 or a voltage for feeding negative ions is applied to both the supporting stand and the grid electrode, it is desirable to keep the correlation as stated above.

The processing carried out in the present invention is the processing to remove unwanted matter, such as etching, ashing or cleaning.

Stated specifically, it includes the etching of silicon and silicon compounds such as silicon oxide and silicon nitride, the etching of metals (inclusive of alloys) and silicides, the ashing of photoresists, the ashing or cleaning of modified cured films of photoresists, the cleaning of foreign matters on surfaces formed of semiconductors, insulating materials, silicides or metals, and the removing of native oxide films.

Figure 3A:
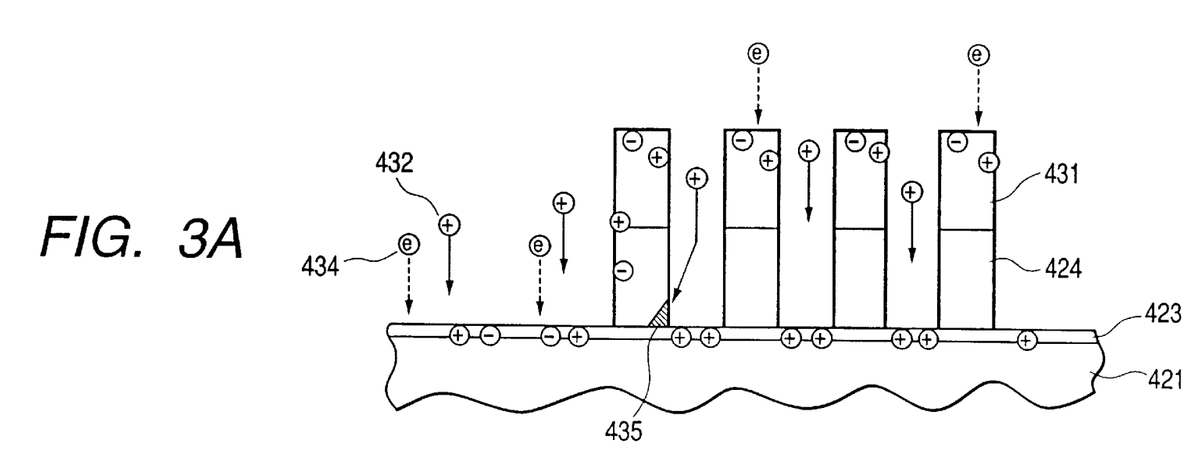
FIGS. 3A and 3B are diagrammatic views to explain the manner of electric charging of a processing target.
Figure 3B:
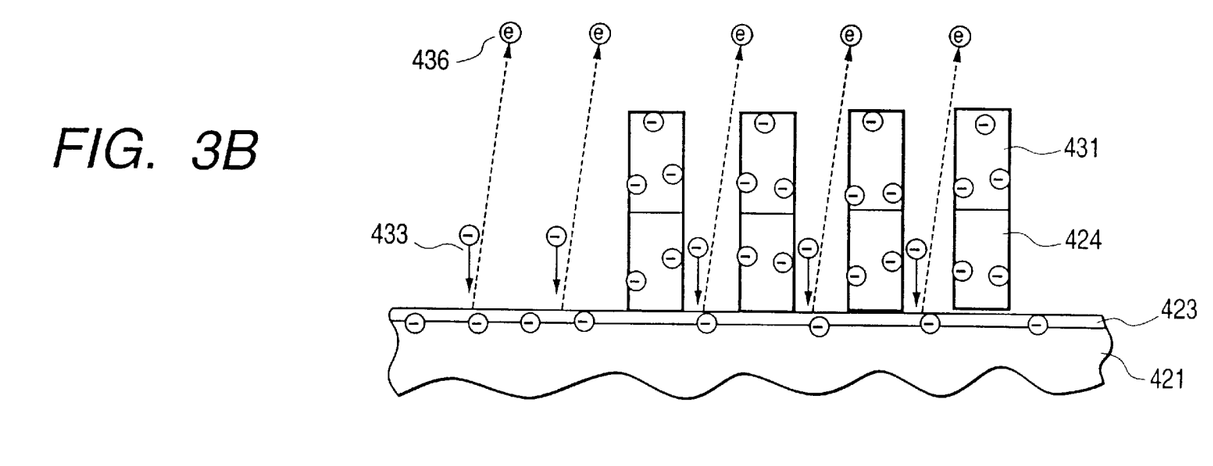

FIGS. 3A and 3B are diagrammatic views to show the cross-sectional structure of a substrate in the step of overetching in a dry-etching process for forming a gate electrode. Reference numeral 421 denotes a substrate; 423, an insulating film; 424, an electrode; 431, a photoresist mask; 432, positive ions; 433, negative ions; 434, electrons; 435, a notching; and 436, secondary electrons. Here, the overetching step refers to etching carried out for an excess time because of a problem of wafer in-plane uniformity, in order to remove any slight gate electrode films remaining partially, after the etching to form the electrode 424 has almost been completed.

FIG. 3A is a diagrammatic cross-sectional view showing an instance of dry etching carried out using positive ions. The positive ions and the electrons 434 are alternately incident on the substrate 421 (semiconductor substrate) in the course of one period of an AC electric field, whereby the charge quantity on the surface of the substrate 421 is kept constant. However, the electrons 434 have a smaller mass than the positive ions 432 and their course may easily be bent. Hence, as shown in FIG. 3A, the positive ions 432 reach the bottoms of holes having a large width/height ratio (aspect ratio), i.e., deep holes, in a larger quantity than the electrons 434 to make the hole bottoms positively charged. As a result, in the outermost wiring of the wirings standing close together as shown in FIG. 3A, a potential difference may occur between it and the region where no wiring is formed, and the course of ions is bent at its electric field, so that an etching malformation called the notching 435 occurs.

Meanwhile, FIG. 3B shows an instance where negative ions are used in the above process. As shown in FIG. 3B, the negative ions 433 have so large a mass that they are uniformly incident on the surface of the substrate 421 without their dependence on the aspect ratio, and the surface of the substrate 421 is slightly negatively charged. The secondary electrons 436 generated upon the incidence of negative ions are captured on a secondary electron capturing grid (not shown) without again attaching to the surface of the substrate 421 having negatively been charged, and hence the surface of the substrate 421 is by no means greatly positively or negatively charged. Thus, under such a condition that the surface of the substrate 421 stand uniformly negatively charged as a result of the processing made using only negative ions, it is by no means possible that the course of ions is bent by the occurrence of any local electric fields, so that the working of gate electrodes free of malformation can be achieved, as so presumed.

Figure 4:
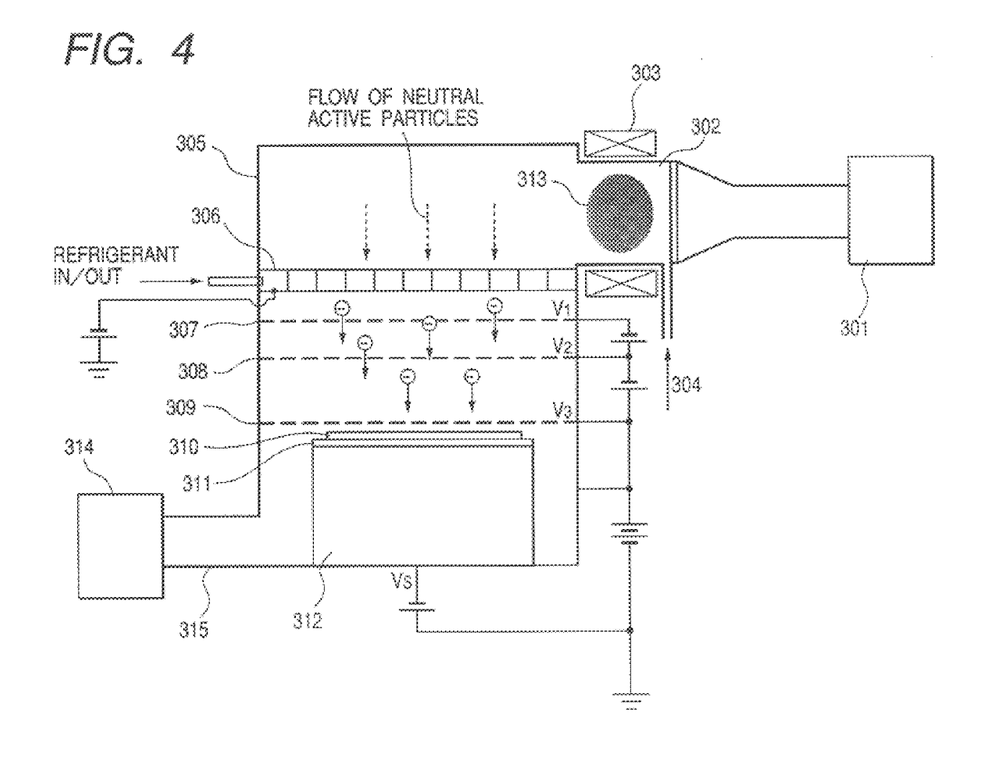
FIG. 4 is a diagrammatic cross-sectional illustration of another example of the plasma processing apparatus according to the present invention.

FIG. 4 illustrates a plasma processing apparatus according to another embodiment of the present invention. Reference numeral 301 denotes a microwave power source as an electric energy feed source; 302, a plasma generating space; 303, a magnetic-field coil; 304, a processing-gas inlet; 305, a processing target processing chamber; 306, a metal member; 307, a first preliminary grid electrode; 308, a second preliminary grid electrode; 309, a grid electrode; 310, a processing target; 311, an insulating plate provided optionally; and 312, a processing target supporting stand.

EXAMPLES

The present invention will be described below in greater detail by giving Examples. The present invention is by no means limited to these.

Example 1

In the present Example, a processing target was etched using the apparatus shown in FIG. 1, and etch rate in that etching was measured. Here, a microwave discharge type plasma source was used as a plasma forming means, and a wafer having a silicon oxide film on which a non-doped polycrystalline silicon film was deposited was used as the processing target 110.

The processing target 110 having the above structure was placed on the supporting stand 112 of the apparatus shown in FIG. 1.

Thereafter, the plasma generating space 102 and the inside of the processing chamber 105 were evacuated by the exhaust means 114 through the exhaust duct 115 until they came to have a degree of vacuum of $5 \times 10^{-6}$ Torr. Subsequently, 100 sccm of $Cl_2$ gas was fed into the plasma generating space 102 through the processing-gas inlet 104, a means for introducing gas into the plasma generating space 102, and a throttle valve (not shown) installed to the exhaust duct 115 was adjusted to set the pressure to 5 mTorr. Then, an electric energy was fed to the gas, and microwaves with a frequency of 2.45 GHz were fed from the microwave power source 101, a means for generating plasma in the plasma generating space 102, at an electric power of 500 W to cause the plasma 113 to take place in the plasma generating space 102.

The plasma 113 thus generated was transported through the transport tube 103 to the side of the processing chamber 105 connected with the plasma generating space 102. In the transport tube 103, the positive ions present in the plasma recombined and neutral active species were formed in a large quantity. The neutral active species were brought into contact with the metal member 106 provided in the processing chamber 105, a voltage of −10 V being kept applied to the metal member, where electric-charge exchange was effected to form negative ions. To take out the negative ions thus formed, DC voltages of +50 V and +75 V were applied to the first preliminary grid electrode 107 and the second preliminary grid electrode 108, respectively. DC voltages of +100 V and +105 V were further applied to the supporting stand 112 and the grid electrode 109, respectively. It follows that the negative ions are made incident on the processing target 110 comprising a semiconductor substrate, at an energy of about 110 eV when the above voltages are applied to the respective grids.

Etch rate of the polycrystalline silicon film processed in the manner as described above was measured. As a result, the etch rate was 200 nm per minute, which was found to be a value which can be well satisfactory also from the viewpoint of mass productivity.

Example 2

In the present Example, the apparatus shown in FIG. 1 was used in a cleaning process carried out before a film for upper-layer metal wiring is formed, in a via hole forming process for connecting different wiring layers of multi-layer wiring in semiconductor fabrication processes. Here, an unfinished semiconductor device having a cross-sectional structure as shown in FIG. 6 was used as the processing target. In FIG. 6, reference numeral 221 denotes a silicon substrate; 222, a device separating insulating film; 223, a gate oxide film; 224, a gate electrode; 225, a first interlayer oxide film; 226, a first-layer metal wiring; 227, a barrier metal of the first-layer metal wiring; 228, a reflection preventive layer of the first-layer metal wiring; 229, a second interlayer oxide film; 230, a via hole formed by dry etching; and 231, a thin oxide layer on the anti-reflection layer surface.

The unfinished semiconductor device having the above structure was placed on the supporting stand 112 of the apparatus shown in FIG. 1.

Thereafter, the plasma generating space 102 and the inside of the processing chamber 105 were evacuated via the exhaust means 114 through the exhaust duct 115 until they came to have a degree of vacuum of $5 \times 10^{-6}$ Torr. Subsequently, 150 sccm of $SF_6$ gas was fed into the plasma generating space 102 through the processing-gas inlet 104, a means for introducing gas into the plasma generating space 102, and a throttle valve (not shown) installed to the exhaust duct 115 was adjusted to set the pressure to 10 mTorr. Then, an electric energy was fed to the gas, and microwaves with a frequency of 2.45 GHz were fed from the microwave power source 101, a means for generating plasma in the plasma generating space 102, at an electric power of 500 W to cause the plasma 113 to take place in the plasma generating space 102.

The plasma 113 thus generated was transported through the transport tube 103 to the inside of the processing chamber 105 connected with the plasma generating space 102. In the transport tube 103, the positive ions present in the plasma recombined and neutral active species were formed in a large quantity. The neutral active species were brought into contact with the metal member 106 provided in the processing chamber 105, a voltage of −10 V being kept applied to the metal member, where electric-charge exchange was effected to form negative ions. To take out the negative ions thus formed, DC voltages of +50 V and +75 V were applied to the first preliminary grid electrode 107 and the second preliminary grid electrode 108, respectively. DC voltages of +100 V and +105 V were further applied to the supporting stand 112 and the grid electrode 109, respectively. It follows that the negative ions are made incident on the processing target 110, an unfinished semiconductor device, at an energy of about 110 eV when the above voltages are applied to the respective grids.

Using fluorine negative ions thus formed, The processing target 110 was subjected to plasma processing (cleaning) for 30 seconds, and thereafter moved to a metal wiring film forming chamber (not shown) while keeping the processing target 110 in vacuum, to carry out deposition for second-layer metal wiring 232, further followed by the steps of patterning and dry etching by using a photoresist, to form the second-layer metal wiring 232. Characteristics of the semiconductor device thus completed were evaluated.

The characteristics of the semiconductor device were evaluated using 100 transistors for evaluation which were fabricated on 8-inch silicon wafers, and by measuring the quantity of electric charges brought in until the gate oxide film of each transistor resulted in breakdown, $Q_{bd}$.

Comparative Example 1

The procedure of Example 1 was repeated except that the conventional apparatus shown in FIG. 5 was used to clean the processing target with positive ions. On the semiconductor device produced in this Comparative Example, too, its characteristics were evaluated in the same manner as in Example 2.

As a result, in the conventional cleaning process making use of positive ions (Comparative Example 1), devices showing a failure that the $Q_{bd}$ was below 10 coulombs were two samples in the 100 samples. On the other hand, in the case of the present invention Example 2) making use of negative ions, it was found that there was no device at all which caused the deterioration of gate oxide film performance.

Example 3

In the present Example, a polycrystalline silicon film was etched and its etch rate was measured in the same manner as in Example 1 except that the apparatus shown in FIGS. 3A and 3B was used and, as the plasma forming means, the microwave discharge type plasma source was replaced with an ECR type plasma source. The wafer having a silicon oxide film on which a non-doped polycrystalline silicon film was deposited was used as the processing target 310.

The processing target 310 having the above structure was placed on the supporting stand 312 of the apparatus shown in FIGS. 3A and 3B.

Thereafter, the plasma generating space 302 and the inside of the processing chamber 305 were evacuated by the exhaust means 314 through the exhaust duct 315 until they came to have a degree of vacuum of $5\times10^{-6}$ Torr. Subsequently, 100 sccm of $Cl_2$ gas was fed into the plasma generating space 302 through the processing-gas inlet 304, a means for introducing gas into the plasma generating space 302, and a throttle valve (not shown) installed to the exhaust duct 315 was adjusted to set the pressure to 5 mTorr. Then, an electric current was flowed to the magnetic-field coil 303 to set the plasma generating space 302 to have a magnetic field of 875 G, and microwaves with a frequency of 2.45 GHz were fed from the microwave power source 301, a means for generating plasma in the plasma generating space 302, at an electric power of 1 kW to cause the plasma 313 to take place in the plasma generating space 302.

The plasma 113 thus generated is diffused along a diffusion magnetic field of the magnetic-field coil 303 to the side of the processing chamber 305 connected with the plasma generating space 302. At this stage, the neutral active species and positive ions were brought into contact with the metal member 306 provided in the processing chamber 305, a voltage of −10 V being kept applied to the metal member, where electric-charge exchange was effected to form negative ions. To take out the negative ions thus formed, DC voltages of +50 V and +75 V were applied to the first preliminary grid electrode 307 and the second preliminary grid electrode 308, respectively. DC voltages of +100 V and +105 V were further applied to the processing target supporting stand 312 and the grid electrode 309, respectively. It follows that the negative ions are made incident on the processing target 310 comprising a semiconductor substrate, at an energy of about 110 eV when the above voltages are applied to the respective grids.

Etch rate of the polycrystalline silicon film processed in the manner as described above was measured. As a result, the etch rate was 270 nm per minute. Thus, it was confirmed that a much higher etch rate can be achieved than the case where the microwave plasma source shown in Example 1 was used.

As described above, the present invention can provide a plasma processing apparatus by which negative ions can be formed in a large quantity and also the negative ions can be made incident on the processing target to etch or clean the processing target. Here, since in the present apparatus the negative ions are predominantly used, it can materialize good plasma processing which may cause no surface charging of the processing target and may cause neither electrostatic breakdown (i.e., charge-up damage) of gate oxide films nor etching malformation due to a bend of the course of ions.

What is claimed is:

1. A process for producing a semiconductor device comprising the steps of:

introducing a gas into a plasma generating space;

feeding electric energy to the gas in the plasma generating space to generate a plasma;

forming negative ions by a metal member which is provided on the downstream of the plasma generating space in such a way that it comes into contact with particles of the plasma; and feeding negative ions to the article by at least one of a grid electrode disposed between the metal member and the article to which a positive voltage is to be applied and the supporting means to which a positive voltage is to be applied, whereby ashing, etching or cleaning of the article is conducted.

2. The process according to claim 1, wherein a gate electrode film of the article is etched using the negative ions.

3. The process according to claim 1, wherein a hole formed in an insulating film of the article is cleaned by the negative ions.

* * * * *